US009620231B2

(12) United States Patent
Jigour et al.

(10) Patent No.: US 9,620,231 B2
(45) Date of Patent: *Apr. 11, 2017

(54) METHOD OF OPERATING A NAND FLASH MEMORY DEVICE

(71) Applicant: Winbond Electronics Corporation, Taichung (TW)

(72) Inventors: Robin John Jigour, San Jose, CA (US); Hui Chen, San Ramon, CA (US); Oron Michael, San Jose, CA (US)

(73) Assignee: Winbond Electronics Corporation, Taichung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/065,301

(22) Filed: Mar. 9, 2016

(65) Prior Publication Data

US 2016/0189789 A1 Jun. 30, 2016

Related U.S. Application Data

(62) Division of application No. 13/799,215, filed on Mar. 13, 2013, now Pat. No. 9,324,450.

(51) Int. Cl.
| | |
|---|---|
| *G11C 16/26* | (2006.01) |
| *G11C 29/04* | (2006.01) |
| *G06F 11/10* | (2006.01) |
| *G11C 16/34* | (2006.01) |
| *G11C 16/20* | (2006.01) |

(52) U.S. Cl.
CPC .......... *G11C 16/26* (2013.01); *G06F 11/1068* (2013.01); *G11C 16/3404* (2013.01); *G11C 29/04* (2013.01); *G11C 16/20* (2013.01); *G11C 2029/0411* (2013.01)

(58) Field of Classification Search
USPC .......................... 365/185.09, 185.17, 185.18
See application file for complete search history.

(56) References Cited

U.S. PATENT DOCUMENTS

| | | | |
|---|---|---|---|
| 2012/0069657 A1* | 3/2012 | Choi | ................... G11C 11/5621 365/185.09 |
| 2012/0155173 A1* | 6/2012 | Lee | ........................ G11C 16/26 365/185.09 |

* cited by examiner

*Primary Examiner* — Hoai V Ho
*Assistant Examiner* — Minh Dinh
(74) *Attorney, Agent, or Firm* — Finnegan, Henderson, Farabow, Garrett & Dunner LLP

(57) ABSTRACT

Serial NAND flash memory may be provided with the characteristics of continuous read of the memory across page boundaries and from logically contiguous memory locations without wait intervals, while also being clock-compatible with the high performance serial flash NOR ("HPSF-NOR") memory read commands so that the serial NAND flash memory may be used with controllers designed for HPSF-NOR memory. Serial NAND flash memory having these compatibilities is referred to herein as high-performance serial flash NAND ("SPSF-NAND") memory. Since devices and systems which use HPSF-NOR memories and controllers often have extreme space limitations, HPSF-NAND may also be provided with the same physical attributes of low pin count and small package size of HPSF-NOR memory for further compatibility. HPSF-NAND memory is particularly suitable for code shadow applications, even while enjoying the low "cost per bit" and low per bit power consumption of a NAND memory array at higher densities.

12 Claims, 6 Drawing Sheets

METHOD OF OPERATING A NAND FLASH MEMORY DEVICE

CROSS-REFERENCE TO RELATED APPLICATIONS

This application is a division of U.S. patent application Ser. No. 13/799,215 filed Mar. 13, 2013, which hereby is incorporated herein in its entirety by reference thereto.

BACKGROUND OF THE INVENTION

Field of the Invention

The present invention relates to digital memory devices, and more particularly to NAND flash memory having physical attributes, read command clocking characteristics, and/or read output characteristics compatible with high performance serial NOR flash memory.

Description of Related Art

Serial NOR flash memory has become a popular alternative to conventional parallel NOR flash memory. Serial NOR flash memories offer several advantages including; lower pin-count, smaller packages, simpler printed circuit boards, lower power, comparable performance and reduced device and system-level costs. Today, serial NOR flash memories are offered in densities from 512 Kilobit to 1 Gigabit, and employ the popular Serial Peripheral Interface ("SPI").

Single-bit SPI uses four pins for transferring commands, address and data to, and data from, the serial flash memory, namely: Chip Select (/CS), Clock (CLK), Data In (DI) and Data Out (DO). Multi-bit SPI which includes Dual SPI, Quad SPI and Quad Peripheral Interface ("QPI") use the same four pins but reconfigurable to transfer more serial data per clock cycle. Dual SPI changes the DI and DO pins to bi-directional DIO (Input/Output) pins. Quad SPI also changes the DI and DO pins to DIO pins, and adds two additional DIO pins for a total of four DIO pins, for a total of six pins when /CS and CLK are considered. QPI has four DIO pins like Quad SPI, but allows for full quad (four DIO) operation even for initial commands. These multi-bit SPI variants, combined with increasing clock speeds, allow Serial NOR Flash to be used for fast code shadowing to Random Access Memory ("RAM"); see, e.g., U.S. Pat. No. 7,558,900 issued Jul. 7, 2009 to Jigour et al.

Code shadowing tends to be performed in the following manner. During system boot-up, all or a portion of the non-volatile data is transferred from the serial NOR flash into system random access memory ("RAM"). Code shadowing may also be done dynamically after system boot, where a smaller RAM may be time-shared as needed by dynamically shadowing portions of the larger serial NOR flash memory.

Since system boot-up time is directly related to how fast the code can be shadowed, the higher the performance of the serial NOR flash, the faster the system can boot. Typically, a single SPI read command is issued with a starting address, and then data is continuously clocked out until all needed code is transfer to RAM. Today's serial NOR flash memory can achieve continuous read transfer rates in excess of 50 megabytes/second when using the quad SPI interface at 104 MHz. Applications like digital TVs, set-top boxes, personal computers, DVD players, networking equipment and automotive displays are examples of applications that benefit from code shadowing with high speed serial NOR flash memory. Application specific controllers commonly design basic serial NOR flash SPI read commands into the hardware circuitry ("hardcoded") so that upon power-up, all or a portion of the data can be quickly loaded into RAM for operation. The 03 hex Read command, for example, is typically hardcoded.

At densities of 256 Megabits and higher, the cost of serial NOR flash memory approaches and exceeds the cost of single level cell ("SLC") NAND flash memory in densities of 512 Megabits and higher. The cost versus density advantage of SLC NAND flash memory is largely due to the inherently smaller memory cell size used in SLC NAND flash technology, which makes the cost to manufacture highly dense NAND flash memory much lower than NOR flash memory. Unfortunately, commonly used SLC NAND flash memory has architectural, performance and bad block limitations that make it difficult to support the high speed code shadow applications for which serial NOR flash memory is well suited.

Serial NOR flash memory allows data to be clocked out of the device from a specified starting address (such as address 0) in a continuous and sequential fashion, without any delay time between clocks or any need to wait and check whether the device is ready or busy. In contrast, NAND flash memory has relatively long access times per page, typically tRD=25 uS for a 2048+64 byte page. Once the page has been accessed, the data is clocked out sequentially and quickly, typically 25 nS per byte, but then another tRD is incurred for the next page access. Some NAND flash memory provide a cache read feature that allows the next page to be accessed while data from the previous page is being clock out. However, this operation still uses a Ready/Busy check to confirm that the NAND flash memory is ready to proceed, which results in slower code shadow performance.

While today's NAND flash memory can ideally achieve read transfer rates of 25 to 35 megabytes/second, this does not take into account time for handling error correction code ("ECC") processing and bad block management. These activities can further reduce the transfer rate by half, and result in performance significantly lower than serial NOR flash memory.

NAND flash memory allows for a certain percentage, typically 2%, of the blocks (typically 64 pages per block, 128 kilobytes+4 kilobytes) to be bad and not usable for the application. Typically, these bad blocks can be located anywhere in the memory array, and so are tagged so that they can be identified and not used. Some NAND flash memories guarantee only the first block to be good. As a result, standard sequential and continuous code shadowing is unreliable since the next block accessed may be bad. In contrast, serial NOR flash memory offers 100% good memory cells over the entire addressable memory range.

The data integrity of NOR flash memory is also better than NAND flash memory. In fact, external application ECC software or internal on-chip ECC circuitry is typically used with SLC NAND flash memory to locate and correct single bit, or in some cases, multi-bit errors. While NAND flash memory with on-chip ECC tend to perform faster than external ECC, undesirable delays of up to 100 uS per page read must be taken into consideration.

Serial NOR flash memory is available with the 4 to 6 active pin SPI interface and in small space efficient packages such as the 8-contact WSON, the 24-ball BGA, and the 8-pin and 16-pin SOIC. In contrast, ordinary parallel NAND flash memory typically employs 14 to 22 active pins housed in a relatively large 48-pin TSOP or 63-Ball BGA package that consumes up to twice the printed circuit board space of a serial NOR flash memory; see, for example, SK Hynix Inc., 1 Gbit (128M×8 bit/64M×16 bit) NAND Flash Memory, Rev. 1.1, November 2005; Micron Technology, Inc., 1 Gb NAND Flash Memory, Rev. E, 2006. Ordinary serial NAND flash memory have been introduced with the SPI interface; see, for example, Micron Technology, Inc., Get More for Less in Your Embedded Designs with Serial NAND Flash, Jul. 28, 2009, but such ordinary serial NAND flash memory tends to be housed in larger packages such as the 63-ball BGA, and have the same architectural, performance and bad block limitations that ordinary NAND flash memory has. Additionally these serial NAND flash memories do not offer command compatibility with the serial NOR flash memories on the market; see, e.g., Winbond Electronics Corporation, W25Q64CV SpiFlash 3V 64M-Bit Serial Flash Memory with Dual and Quad SPI, Revision F, May 7, 2012; Winbond Electronics Corporation, W25Q128FV SpiFlash 3V 128M-Bit Serial Flash Memory with Dual/Quad SPI & QPI, Revision D, Oct. 1, 2012.

BRIEF SUMMARY OF THE INVENTION

While serial NOR flash memory is a popular solution for code shadowing applications, the cost structure at higher densities is not favorable when compared with the cost structure for NAND flash memory. While serial NAND flash memory has been introduced, it has architectural, performance and bad block limitations that compromise its usefulness for high performance sequential and continuous code shadowing, and does not offer command compatibility with serial NOR flash memory.

What is needed is a serial NAND flash memory that retains its cost advantage over serial NOR flash memory at high density, yet can accept serial NOR flash memory compatible read commands for use with existing serial NOR controllers, and is package-compatible with and has architectural and performance characteristics comparable to serial NOR flash memory to enable continuous read without delays throughout the memory for code shadowing operations.

One or more of these and other advantages may be achieved by the various embodiments of the present invention. One embodiment of the present invention is a serial NAND flash memory comprising: a package selected from a group consisting of an 8-pin WSON package, a 24-pin FBGA package, an 8-pin SOIC package, and a 16-pin SOIC package, wherein at least some of the pins of the package are active pins of an SPI interface; a NAND flash memory array contained in the package; a page buffer contained in the package and coupled to the NAND flash memory array; and control logic contained in the package and coupled to the NAND flash array and the page buffer for providing, in response to a read command, data output from the NAND flash memory device to at least one of the pins of the active SPI interface via the page buffer.

Another embodiment of the present invention is a serial NAND flash memory device comprising: a package having a footprint of 48 millimeters squared or less, and an active SPI interface of from four to six pins; a NAND flash memory array contained in the package; a page buffer contained in the package and coupled to the NAND flash memory array; and control logic contained in the package and coupled to the NAND flash array and the page buffer for providing, from the NAND flash memory device to at least one of the pins of the active SPI interface via the page buffer, in response to a read command, a continuous data output across page boundaries and from logically contiguous memory locations without wait intervals.

Another embodiment of the present invention is a serial NAND flash memory device comprising: an interface; a NAND flash memory array; a page buffer coupled to the NAND flash memory array; a control logic coupled to the NAND flash memory array and the page buffer for providing, from the NAND flash memory device to the interface via the page buffer, in response to a read command, a continuous data output across page boundaries and from logically contiguous memory locations without wait intervals; and a power-up detector for initiating loading of a default page of the NAND flash memory array to the page buffer upon power-up.

Another embodiment of the present invention is a method of operating a NAND flash memory device comprising: receiving a read command which corresponds to a high-performance serial flash NOR ("HPSF-NOR") read command and is clock-compatible therewith; and providing, from the NAND flash memory device in response to the read command receiving step, a continuous data output across page boundaries and from logically contiguous memory locations without wait intervals.

Another embodiment of the present invention is a method of operating a memory having a NAND flash memory array and a page buffer associated with the NAND flash memory array, comprising: selecting a page of the NAND flash memory array; storing data from the selected page in the page buffer; performing ECC computations on the data in the page buffer; outputting the data from the page buffer; and repeating the page selecting, data storing, ECC computation performing, and data outputting steps so that data output is continuous across page boundaries and from logically contiguous memory locations without wait intervals; wherein the page selecting step initially comprises selecting a default page in the NAND flash memory array, and subsequently comprises selecting successive sequential pages of the NAND flash memory array; wherein the page selecting, data storing, and ECC computation performing steps are initially performed automatically during power-up of the flash memory, and are subsequently performed in response to a read command; and wherein the data outputting step is performed in response to the read command.

Another embodiment of the present invention is a method of operating a NAND flash memory comprising: selecting a default page of a NAND flash memory array of the NAND flash memory during power-up thereof; storing data from the default page of the NAND flash memory array in a page buffer during power-up of the NAND flash memory; performing ECC computations on the data stored in the page buffer after the storing step; receiving a read command; and providing, from the NAND flash memory via the page buffer and in response to the read command receiving step, a continuous data output across page boundaries and from logically contiguous memory locations without wait intervals.

Another embodiment of the present invention is a method of powering up flash memory having a NAND flash memory array and a page buffer associated with the NAND flash memory array, comprising: setting the flash memory in a continuous read mode or a buffer read mode; transferring a page of data from a default page of the NAND flash memory array to the page buffer; ECC processing the default page of data in the page buffer to provide an ECC processed default page of data; after the data storing step and the ECC processing step, receiving a read command; and when the flash memory is in the continuous read mode, outputting from the flash memory in response to the read command receiving step, a continuous data output across page boundaries and from logically contiguous memory locations without wait intervals, beginning with the ECC processed default page of data in the page buffer; and when the flash memory is in the buffer read mode, outputting from the flash memory in response to the read command receiving step, a data output limited to data in the page buffer.

Another embodiment of the present invention is a method of operating a memory having a NAND flash memory array and a page buffer coupled to the NAND flash memory array, comprising: receiving a continuous read command comprising a command code and a starting address; and providing, from the NAND flash memory array via the page buffer and in response to the read command receiving step, a continuous data output across page boundaries and from logically contiguous memory locations without wait intervals; wherein the providing step begins with column 00 of the page buffer regardless of the starting address.

DETAILED DESCRIPTION OF THE INVENTION, INCLUDING THE BEST MODE

Figure 1:
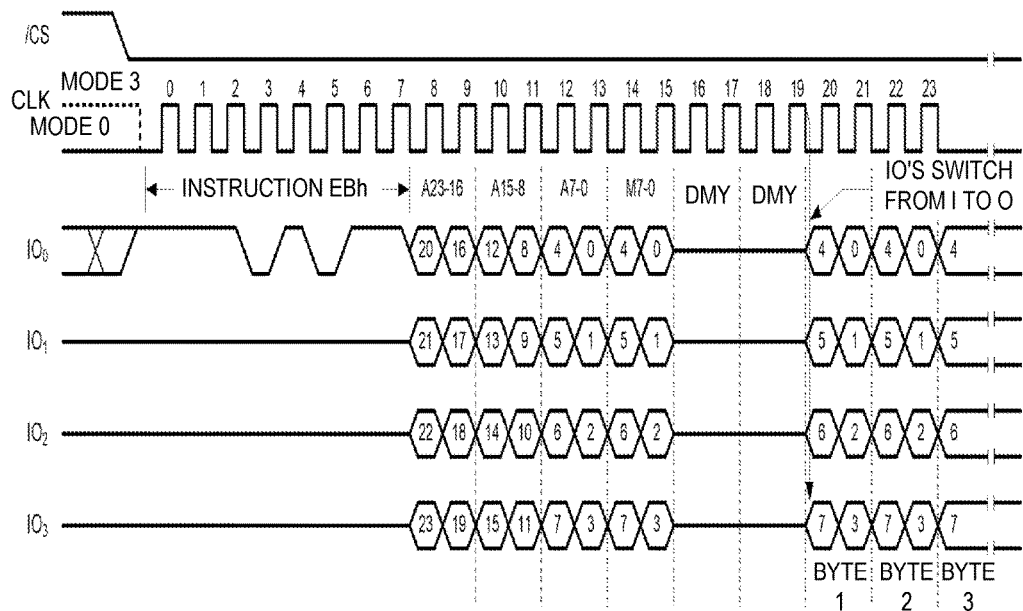
FIG. 1 is a timing diagram for the EBh command for a serial NOR flash memory.

High Performance serial flash memory which uses NOR memory array technology ("HPSF-NOR") such as types W25Q64CV and W25Q128FV available from Winbond Electronics Corporation of San Jose, Calif., USA, and described in, for example, various data sheets such as Winbond Electronics Corporation, W25Q64CV SpiFlash 3V 64M-Bit Serial Flash Memory with Dual and Quad SPI, Revision F, May 7, 2012, and Winbond Electronics Corporation, W25Q128FV SpiFlash 3V 128M-Bit Serial Flash Memory with Dual/Quad SPI & QPI, Revision D, Oct. 1, 2012, which hereby are incorporated herein in their entirety by reference thereto, has certain read characteristics which render the HPSF-NOR memory particularly suitable for applications involving code shadowing (transference of executable code or data such as parameters, text, images, audio, and so forth), which are common in such electronic devices and systems as digital televisions, set-top boxes, personal computers, DVD players, networking equipment and automotive displays. These read characteristics are a continuous read of the memory across page boundaries and from logically contiguous memory locations without wait intervals. The term "continuous read across page boundaries" as used herein refers to a read which proceeds sequentially through the memory in response to a single read command, without need for any additional read commands or addresses at page boundaries. The term "wait interval" as used herein refers to any gap in the data output stream due to a page read ("tRD"), ECC processing, bad block management, ready/busy status checking, or any other architecture-required or application-required delay. Moreover, physical space commonly is at a premium in such electronic devices and systems, and the HPSF-NOR memory also has certain physical attributes such as low pin count and small package size which render the HPSF-NOR memory particularly suitable for such electronic devices and systems. Application specific controllers are available that use HPSF-NOR memory for system boot and code shadow application and are designed to issue commands which are compliant with the command input requirements of the HPSF-NOR memory, including read command clocking requirements. Application specific memory controllers also may design one or more basic HPSF-NOR read commands into the hardware circuitry ("hardcoded"), so that upon power-up and even during normal operation, all or a large portion of the stored data can be quickly loaded into RAM for operation. The hardcoded command(s) may include the Read command 03h and the Fast Read command 0Bh, and may also include any of the available Multi-I/O Read commands. The hardcoded starting address for the controller is commonly address 0, but other address locations may be used if desired.

As described herein, serial NAND flash memory may be made compatible with the characteristics of a continuous read of the memory across page boundaries and from logically contiguous memory locations without wait intervals, while also being clock-compatible with the HPSF-NOR read commands so that the serial NAND flash memory can accept HPSF-NOR read commands and be used with controllers designed for HPSF-NOR memory. Serial NAND flash memory having these compatibilities is referred to herein as high-performance serial flash NAND memory, or "HPSF-NAND." Since devices and systems which use HPSF-NOR memories and controllers often have extreme space limitations, HPSF-NAND may also be provided with the same physical attributes of low pin count and small package size of HPSF-NOR memory for further compatibility, even in some circumstances to the extent that a HPSF-NAND memory may have an identical footprint to and the identical pinout of a HPSF-NOR memory and may be substituted for it in a printed circuit board without any change to the printed circuit board. Although compatible with HPSF-NOR characteristics, HPSF-NAND enjoys the low "cost per bit" and low per bit power consumption of a NAND memory array in its optimal density range of 512 Mb and greater.

HPSF-NAND memory may be made compatible with many characteristics of HPSF-NOR memory, including: (1) the multi-I/O SPI/QPI interface; (2) small low pin count package types (as small as 8×6 mm at densities of 256 Mb and higher) such as, for example, the 8-contact WSON, 16-pin SOIC, and the 24-ball BGA type packages, with the flexibility of using larger packages such as VBGA-63 typically used with ordinary parallel and ordinary serial NAND flash memory; (3) high clock frequency operation (illustratively 104 MHz) for high transfer rates (illustratively 50 MB/Sec); (4) continuous read across page boundaries without wait intervals, for fast code shadowing applications; (5) logically contiguous addressable good memory through bad block management which is transparent to the external systems and which is without adverse impact on the speed and continuity of the output; and (6) an output starting address of zero or alternatively any other address within the user-addressable space of the memory array via a user-specified or manufacturer-specified value. Advantageously, HPSF-NAND as described herein may be used with existing HPSF-NOR memory controllers and systems, yet may have a cost that is comparable to ordinary NAND flash memory.

Table 1 provides a summary comparison of various features of ordinary parallel SLC NAND memory, ordinary serial NAND memory, and HPSF-NOR memory with the HPSF-NAND memory described herein.

TABLE 1

| FEATURE | ORDINARY PARALLEL NAND | ORDINARY SERIAL NAND | HPSF-NOR | HPSF-NAND |
|---|---|---|---|---|
| Optimal Density Range (Cost per bit) | ≥512 Mb | ≥512 Mb | ≤256 Mb | ≥512 Mb |
| Continuous Read Without Wait Intervals (suitable for code shadow) | NO (1) Read 1 page at a time (2) Wait for tRD, ECC, and/or Ready/Busy | NO (1) Read 1 page at a time (2) Wait for tRD, ECC, and/or Ready/Busy | YES (1) No Ready/Busy between pages (2) ECC not needed | YES (1) No Ready/Busy between pages (Buried tRD) (2) Buried ECC time |
| Logically contiguous Addressable Good Memory | NO Bad Blocks disallow contiguous memory | NO Bad Blocks disallow contiguous memory | YES | YES Bad Blocks mapped out to end of user-addressable memory |
| Clock-Compatible Serial Flash Read Commands | NO | NO | YES | YES |
| Clock Frequency | 40 MHz | 50 MHz | 104 MHz | 104 MHz |
| Transfer Rate | 20 MB/Sec-50 MB/Sec | About 15 MB/Sec | 50 MB/Sec | 50 MB/Sec |
| Interface | ONFI | Multi I/O SPI | Multi I/O SPI | Multi I/O SPI |
| Package Type | TSOP-40 BGA-63 | VBGA-63 | WSON-8 FBGA-24 SOIC-8 SOIC-16 | WSON-8 FBGA-24 SOIC-8 SOIC-16 VBGA-63 |
| Smallest Package (256 Mb or higher density) | 9 × 11 mm | 9 × 11 mm | 8 × 6 mm | 8 × 6 mm |
| Typical Number of Interface Pins | 14/22 | 4/6 | 4/6 | 4/6 |
| Compatible Pin-Outs and Packages with Serial Flash | NO | NO | YES | YES |

Clock-Compatible Serial Flash Read Commands

HPSF-NOR memory devices such as types W25Q64CV and W25Q128FV available from Winbond Electronics Corporation of San Jose, Calif., USA, support a variety of SPI commands, including various read commands. Several illustrative read commands which are supported in SPI mode, for example, are shown in Table 2.

TABLE 2

| Byte1 Command OpCode | Byte2 | Byte3 | Byte4 | Byte5 | Byte6 | Byte7 | Byte8 |
|---|---|---|---|---|---|---|---|
| READ 03h | A23-A16 | A15-A8 | A7-A0 | D7-D0 | D7-D0 | D7-D0 | D7-D0 |
| FAST READ 0Bh | A23-A16 | A15-A8 | A7-A0 | DUMMY | D7-D0 | D7-D0 | D7-D0 |
| FAST READ DUAL OUTPUT 3Bh | A23-A16 | A15-A8 | A7-A0 | DUMMY | D7-D0 | D7-D0 | D7-D0 |

TABLE 2-continued

| Byte1 Command OpCode | Byte2 | Byte3 | Byte4 | Byte5 | Byte6 | Byte7 | Byte8 |
|---|---|---|---|---|---|---|---|
| FAST READ QUAD OUTPUT 6Bh | A23-A16 | A15-A8 | A7-A0 | DUMMY | D7-D0 | D7-D0 | D7-D0 |
| FAST READ DUAL I/O BBh | A23-A16 | A15-A8 | A7-A0 | M7-M0 | D7-D0 | D7-D0 | D7-D0 |
| FAST READ QUAD I/O EBh | A23-A16 | A15-A8 | A7-A0 | M7-M0 | DUMMY | DUMMY | D7-D0 |

The Read command 03h allows one or more data bytes to be sequentially read from the page buffer 338. Byte2, Byte3 and Byte4 contain a 24-bit address for reading out a data byte from the addressed memory location. The 03h Read command plus address uses a total of 32 clocks before data is made available. The address is automatically incremented to the next higher address after each byte of data is shifted out, allowing for a continuous stream of data for as long as the clock continues. The command is completed by driving /CS high. The Fast Read command 0Bh is similar to the Read command except that it can operate at the highest specified frequency due to the inclusion of 8 dummy clocks after the 24-bit address. The dummy clocks allow the devices internal circuits additional time for setting up the initial address. The 0Bh Fast Read command plus address uses a total of 40 clocks before data is made available. The Fast Read Dual Output command 3Bh is similar to the 0Bh Fast Read command except that data is output on two pins, IO$_0$ and IO$_1$, instead of one pin. The Fast Read Quad Output command 6Bh is also similar to the 0Bh Fast Read command except that data is output on four pins, IO$_0$, IO$_1$, IO$_2$ and IO$_3$. The Fast Read Dual I/O command BBh and the Fast Read Quad I/O command EBh are similar to the 3Bh Fast Read Dual Output command and the 6Bh Fast Read Quad Output command, but with the capability to input the Address bits (A23-A0) either two or four bits per clock, respectively. The Fast Read Dual I/O and the Fast Read Quad I/O commands also include 8 mode bits M7-M0 after the 24-bit address.

Table 3 lists a number of illustrative read commands for the HPSF-NAND memory which correspond to and are clock-compatible with—that is, have the same "address/dummy" cycle numbers or clocks as—the read commands of Table 2 for the HPSF-NOR memory.

TABLE 3

| Byte1 Command OpCode | Byte2 | Byte3 | Byte4 | Byte5 | Byte6 | Byte7 | Byte8 |
|---|---|---|---|---|---|---|---|
| READ 03h | DUMMY | DUMMY | DUMMY | D7-D0 | D7-D0 | D7-D0 | D7-D0 |
| FAST READ 0Bh | DUMMY | DUMMY | DUMMY | DUMMY | D7-D0 | D7-D0 | D7-D0 |
| FAST READ DUAL OUTPUT 3Bh | DUMMY | DUMMY | DUMMY | DUMMY | D7-D0 | D7-D0 | D7-D0 |
| FAST READ QUAD OUTPUT 6Bh | DUMMY | DUMMY | DUMMY | DUMMY | D7-D0 | D7-D0 | D7-D0 |
| FAST READ DUAL I/O BBh | DUMMY | DUMMY | DUMMY | DUMMY | D7-D0 | D7-D0 | D7-D0 |
| FAST READ QUAD I/O EBh | DUMMY | DUMMY | DUMMY | DUMMY | DUMMY | DUMMY | D7-D0 |

As will be appreciated from a comparison of Table 2 and Table 3, dummy bytes are used in place of the address and mode bytes, so that the HPSF-NAND read commands of Table 3 are clock-compatible with the HPSF-NOR read commands of Table 2 to which they correspond. The HPSF-NAND read commands of Table 3 perform the same read functions as the HPSF-NOR read commands of Table 2 to which they correspond, and allow for the same continuous stream of data for as long as the clock continues. This ensures that, regardless of the address the controller provides while clocking in a HPSF-NOR Read command, data will come out of the HPSF-NAND memory and is continuously clocked out in the same way as HPSF-NOR memory operates. They differ in that for the HPSF-NAND read commands, reading starts from Column 00 of whatever page resides in the memory buffer, whereas for the HPSF-NOR read commands, reading starts from any array location specified by A[23:0].

If desired, HPSF-NAND read commands may specify the address location, and the HPSF-NAND memory may begin the read at the column specified in the address. Various design considerations for this implementation include the system clock (relatively slow), speed of certain internal operations such as ECC (relatively fast), and allowable starting locations in the page buffer, so that sufficient time may be provided for the subsequent operation. Starting the read at Column 00 relaxes such design constraints without sacrificing the usefulness of the HPSF-NAND memory for code shadowing.

For memory densities of 256 Mb and greater, the standard SPI read commands use an additional byte of address. Table 4 shows several illustrative read commands for large density HPSF-NOR memory, and Table 5 shows corresponding read commands for large density HPSF-NAND memory.

TABLE 4

| Byte1 Command OpCode | Byte2 | Byte3 | Byte4 | Byte5 | Byte6 | Byte7 | Byte8 | Byte9 |
|---|---|---|---|---|---|---|---|---|
| READ 03h | A31-A24 | A23-A16 | A15-A8 | A7-A0 | D7-D0 | D7-D0 | D7-D0 | D7-D0 |
| FAST READ 0Bh | A31-A24 | A23-A16 | A15-A8 | A7-A0 | DMY | D7-D0 | D7-D0 | D7-D0 |
| FAST READ DUAL OUTPUT 3Bh | A31-A24 | A23-A16 | A15-A8 | A7-A0 | DMY | D7-D0 | D7-D0 | D7-D0 |
| FAST READ QUAD OUTPUT 6Bh | A31-A24 | A23-A16 | A15-A8 | A7-A0 | DMY | D7-D0 | D7-D0 | D7-D0 |
| FAST READ DUAL I/O BBh | A31-A24 | A23-A16 | A15-A8 | A7-A0 | M7-M0 | D7-D0 | D7-D0 | D7-D0 |
| FAST READ QUAD I/O EBh | A31-A24 | A23-A16 | A15-A8 | A7-A0 | M7-M0 | DMY | DMY | D7-D0 |

TABLE 5

| Byte 1 Command OpCode | Byte2 | Byte3 | Byte4 | Byte5 | Byte6 | Byte7 | Byte8 | Byte9 |
|---|---|---|---|---|---|---|---|---|
| READ 03h | DMY | DMY | DMY | DMY | D7-D0 | D7-D0 | D7-D0 | D7-D0 |
| FAST READ 0Bh | DMY | DMY | DMY | DMY | DMY | D7-D0 | D7-D0 | D7-D0 |
| FAST READ DUAL OUTPUT 3Bh | DMY | DMY | DMY | DMY | DMY | D7-D0 | D7-D0 | D7-D0 |
| FAST READ QUAD OUTPUT 6Bh | DMY | DMY | DMY | DMY | DMY | D7-D0 | D7-D0 | D7-D0 |
| FAST READ DUAL I/O BBh | DMY | DMY | DMY | DMY | DMY | D7-D0 | D7-D0 | D7-D0 |
| FAST READ QUAD I/O EBh | DMY | DMY | DMY | DMY | DMY | DMY | DMY | D7-D0 |

Figure 2:
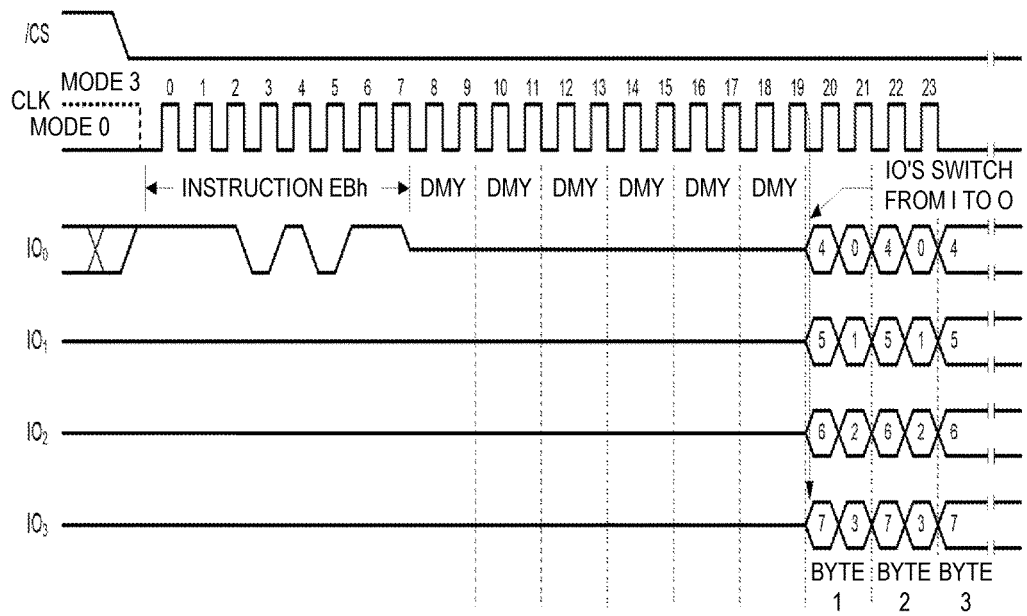
FIG. 2 is a timing diagram for the EBh command for an operation mode of a serial NAND flash memory.

FIG. 1 is an illustrative timing diagram of the Fast Read Quad I/O command for the HPSF-NOR memory, and FIG. 2 is an illustrative timing diagram of the Fast Read Quad I/O command for the HPSF-NAND memory. These figures may be compared to better understand the clock-compatibility of the two commands. The EBh command is received during the first eight clocks 0 through 7 for both memory types. During the next eight clocks 8 through 15, the 24-bit address is received over pins $IO_0$, $IO_1$, $IO_2$ and $IO_3$ of the HPSF-NOR memory, while the states of the pins $IO_0$, $IO_1$, $IO_2$ and $IO_3$ are ignored by the HPSF-NAND memory. The next four clocks 16 through 19 are dummy clocks corresponding to two dummy bytes for both memory types, and clock 20 begins continuous data output on the pins $IO_0$, $IO_1$, $IO_2$ and $IO_3$ of both memory types.

Mode Selection

While the HPSF-NOR continuous read starting from Column 00 of the page resident in the memory buffer is particularly advantageous for code shadow operations, need may arise for operation in other modes. One example is when a read is desired which begins at a column address other than 00. While this capability may be obtained by modifying the HPSF-NAND memory continuous read feature to use a starting address, another approach is to provide mode switching. Mode switching may also be used to switch to a mode which does not support the continuous read across page boundaries without wait intervals. Another example is when a HPSF-NAND memory is desired to power up in the HPSF mode for code shadowing to RAM, but then operate in another mode compliant with a NAND memory standards such as the Open NAND Flash Interface ("ONFI") and ordinary serial NAND flash memory. Alternatively, the HPSF-NAND memory may power up by default in the other mode, and be switchable to the continuous read mode.

One may desire, for example, for a HPSF-NAND memory to be switchable between a continuous read mode and a buffer read (single page read) mode. Table 6 shows the timing for an illustrative Read command 03h for an ordinary serial NAND flash memory, which operates in buffer read mode. The timings for other commands such as the Fast Read command 0Bh, the Fast Read Dual Output command 3Bh, the Fast Read Quad Output command 6Bh, the Fast Read Dual I/O command BBh, and the Fast Read Quad I/O command EBh may be established for the ordinary serial NAND flash memory in a similar manner as for the Read command 03h. The timing for the ordinary serial NAND flash memory uses two bytes for column address C[15:0] and one dummy byte following the column address bytes. Not shown in Table 6 due to space limitations is that the data streamed in response to the Read command for the ordinary serial NAND flash memory either terminates at the end of the buffer or wraps around to the start of the buffer, until terminated by a /CS transition. If one desires to read additional pages, a further command may be issued, but this action comes at the expense of delays due to Ready/Busy checking and the time needed to read a page from the NAND memory array.

TABLE 6

| Byte1 Command OpCode | Byte2 | Byte3 | Byte4 | Byte5 | Byte6 | Byte7 | Byte8 |
|---|---|---|---|---|---|---|---|
| ORDINARY SERIAL NAND FLASH READ 03 h | C15-C8 | C7-C0 | DUMMY | D7-D0 | D7-D0 | D7-D0 | D7-D0 |

Figure 3:
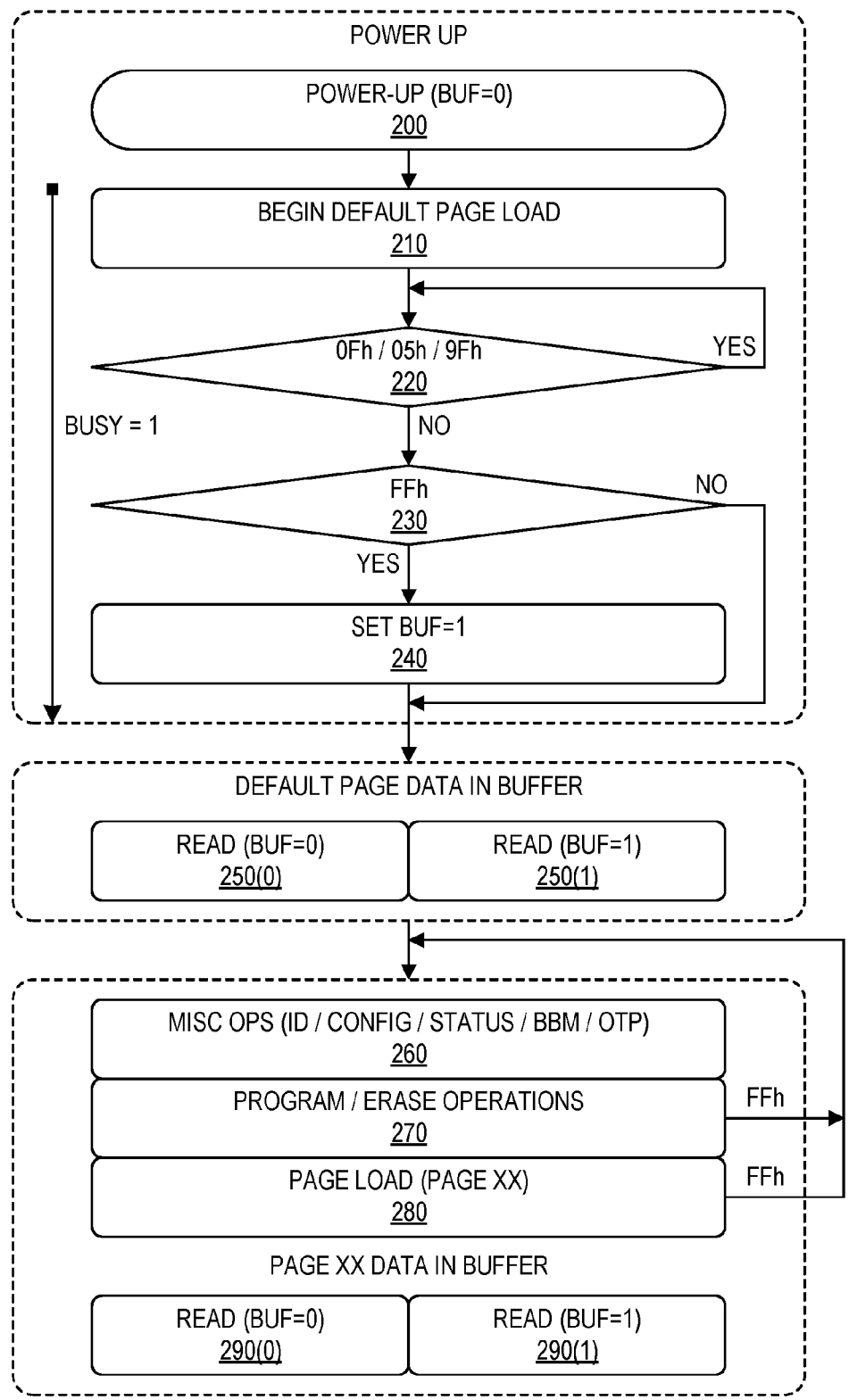
FIG. 3 is a flowchart showing the operations of a serial NAND flash memory during power-up and in use.

FIG. 3 shows an illustrative process of mode selection for a HPSF-NAND memory during and after power-up, in which the HPSF-NAND memory starts up by default in the continuous read mode in which various read commands have the same syntax as HPSF-NOR commands and are command clocking compatible and continuous read output compatible therewith, and thereafter is switchable to an ordinary serial NAND flash memory buffer read mode or to the continuous page read mode as desired. Upon power-up (block 200), a buffer mode flag BUF is set to 0 by default, and automatic loading of a default page into the buffer of the serial NAND flash memory is begun (block 210). Illustratively the default page is page 0, although any page may be established in the serial NAND flash memory as the default page. An illustrative technique for setting the default page is to store the default page address in a configuration register (not shown), access to which may be restricted to the manufacturer or open to the OEM or user. At the start of loading of the default page, a BUSY flag is set to 1 to prevent the default page load from being interrupted by another command. However, certain commands may be allowed to be functional during the busy period without affecting the buffer mode flag BUF, such as, for example, the Get Feature or Read Status Register command 05h or 0Fh to check the BUSY flag, and the JEDEC ID command 9Fh to check device identification (block 220). Other commands may be allowed to change the buffer mode flag to 1 during the busy period, such as, for example, the Device Reset command FFh may be used (block 230 yes and block 240); otherwise the buffer mode remains 0 for (illustratively) all other commands (block 230 no).

Alternatively or additionally, the buffer mode flag BUF may be changed to 1 if the first command (not shown) after the BUSY flag returns to 0 is the Device Reset command FFh. Any other command leaves BUF=0 and is executed in the normal manner.

A read command received after the busy period is executed in a manner which depends on the value of BUF. If BUF=0, any column address data in the command is ignored and the read operation (block 250(0)) starts from 0x00h column and continues through successive pages until terminated when /CS is asserted high. If BUF=1, the read operation (block 250(1)) begins at the column address [11:0] specified in the command and terminates when the end of the buffer is read or when /CS is asserted high.

Figure 4:
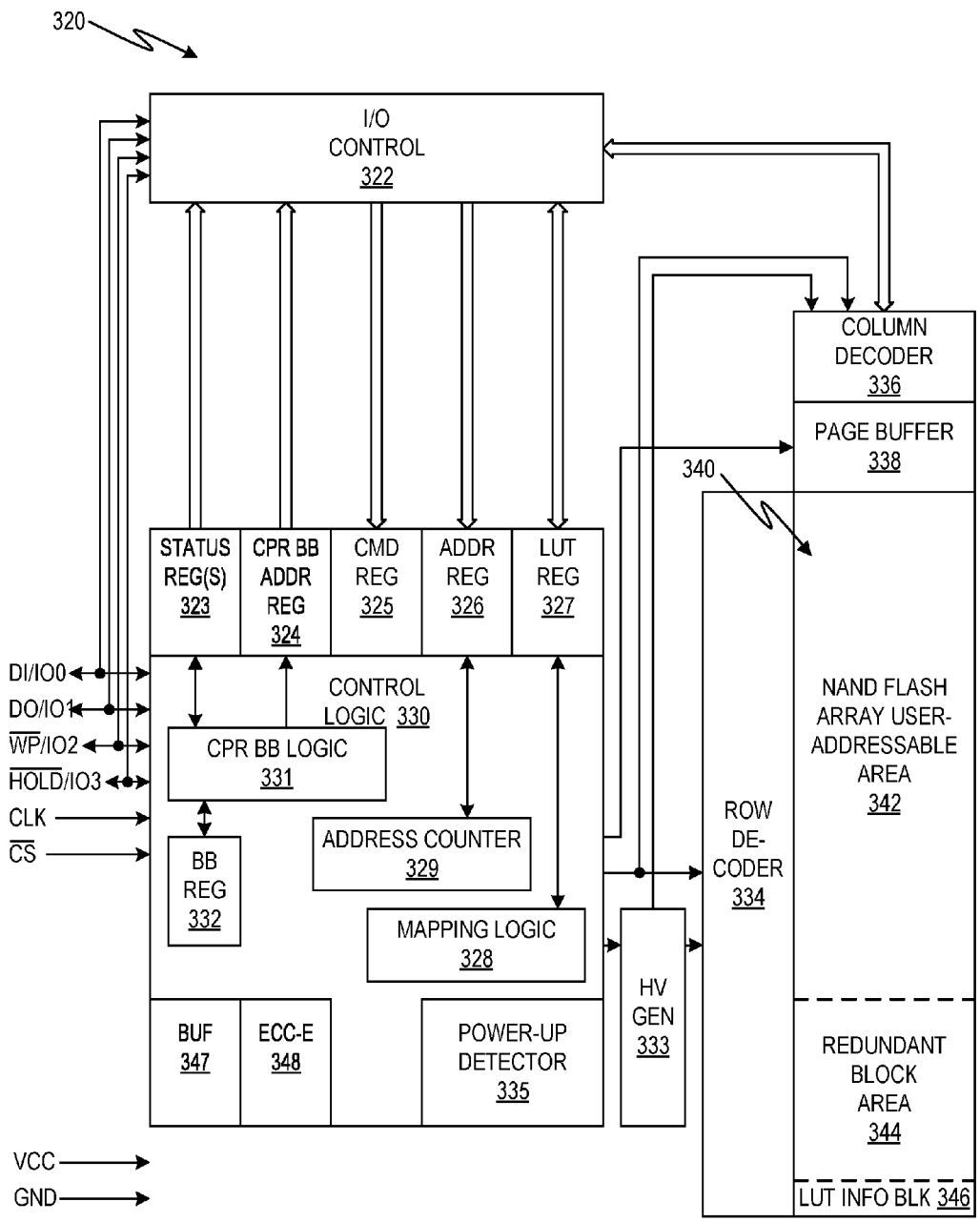
FIG. 4 is a schematic functional block diagram of a NAND flash memory.

Thereafter, the memory may be operated as desired using various miscellaneous operations (block 260), program and erase operations (block 270), page load operations (block 280), and read operations (block 290(0) or block 290(1) depending on the value of BUF. The buffer mode flag BUF may be set at either 0 or 1 as many times as desired during normal operation by writing to BUF in the status register using the Set Feature or Write Status Register command 1 Fh or 01 h. The Device Reset command FFh may be used to interrupt any on-going internal operations. The page load operation (block 280) may be initiated using the Page Data Read command 13h, which allows a full page of data to be read from the NAND flash array 342 (FIG. 4) into the page buffer 338 (FIG. 4). Byte2 contains dummy bits for timing, and Byte3 and Byte4 contain the page address. A read command received after a page load of page XX (block 280) is executed in a manner which depends on the value of BUF. If BUF=0, any column address data in the command is ignored and the read operation (block 290(0)) starts from 0x00h column and continues through successive pages until terminated when /CS is asserted high. If BUF=1, the read operation (block 290(1)) begins at the column address [11:0] specified in the command and terminates when the end of the buffer is read or when /CS is asserted high.

Serial NAND Flash Memory Architecture

FIG. 4 is a schematic functional block diagram of an illustrative HPSF-NAND memory 320 which is capable of providing a continuous read across page boundaries and from logically contiguous memory locations without wait intervals. The serial NAND flash memory 320 includes a NAND flash array 340 and associated page buffer 338. The NAND flash array 340 includes word (row) lines and bit (column) lines, and is organized into a user-addressable area 342, a redundant block area 344, and a LUT information block 346. Any desired flash memory cell technology may be used for the flash memory cells of the NAND flash array 340. The serial NAND flash memory 320 may include various other circuits to support memory programming, erase and read, such as row decoder 334, column decoder 336, I/O control 322, status register(s) 323, continuous page read ("CPR") address register(s) 324, command register 325, address register 326, a LUT register 327, control logic 330, CPR bad block logic 331, a CPR bad block register 332, and high voltage generators 333. The row decoder 334 selects rows of the user-addressable area 342 under user control as well as, in some implementations, under internal control; and selects rows of the redundant block area 344 and LUT information block 346 under internal control. Power is supplied (not shown) throughout the circuits of the HPSF-NAND memory 320 by power lines VCC and GND. While the NAND flash memory 320 may be packaged in any desired manner and may have any type of interface, including ordinary NAND flash memory interfaces, the control logic 330 of FIG. 4 illustratively implements the SPI/QPI protocol, including the multi-IO SPI interface. Additional detail on the SPI/QPI interface and on the various circuits of the memory may be found in U.S. Pat. No. 7,558,900 issued Jul. 7, 2009 to Jigour et al., and in a publication by Winbond Electronics Corporation, W25Q64DW: SpiFlash 1.8V 64M-Bit Serial Flash Memory with Dual/Quad SPI & QPI: Preliminary Revision C, Hsinchu, Taiwan, R.O.C., Jan. 13, 2011, which hereby are incorporated herein in their entirety by reference thereto.

If mode switching is desired, a buffer mode flag BUF 347 may be provided. The buffer mode flag 347 may be provided as a bit of the status register(s) 323 if desired. A power-up detector 335 is provided in the control logic 330 to initiate the setting of a particular mode and the loading of a default page upon power-up.

The page buffer 338 illustratively includes a one-page data register (not shown), a one-page cache register (not shown), and one page of transmission gates (not shown) for copying data from the data register to the cache register. Any suitable latch or memory technology may be used for the data register and the cache register, and any suitable gating technology may be used for the transmission gates. The data register and the cache register may be organized in any desired number of respective portions by, for example, the manner in which the transmission gates are wired and operated to control transmission of data. Illustratively, the data register and the cache register may be organized in two respective portions each, and operated in alternation by using respective groups of transmission gates controlled by respective control lines. The data register and the cache register of the page buffer 338 may be operated in a conventional manner by applying the same control signal to respective transmission gate control lines, or may be operated in alternation by applying suitable timed control signals to the transmission gate control lines. Illustratively in a two portion implementation in which a page is 2K Bytes, a half-page (1K) of transmission gates may be controlled by one control line and the other half-page (1K) of transmission gates may be controlled by another control line, thereby organizing the data register and the cache register in two half-page (1K) portions. Because of the operation of two portions in alternation, a two-portion implementation of the page buffer 338 may be referred to as a "ping pong" buffer. An ECC circuit (not show) may be provided to perform ECC computations on the contents of the cache register depending on the status of an ECC-E flag 348. The ECC-E flag 348 may be provided as a bit of the status register(s) 323 if desired. Additional detail on the page buffer 338, the ECC circuit, and their operations may be found in U.S. patent application Ser. No. 13/464,535 filed May 4, 2012 (Gupta et al., Method and Apparatus for Reading NAND Flash Memory), which hereby is incorporated herein in its entirety by reference thereto. Continuous page read as described herein is referred to as "modified continuous page read" in the aforementioned patent application. This manner of organizing the data register and cache register into portions and performing ECC on the portions is illustrative, and other techniques may be used if desired.

While the NAND flash memory 320 is organized and operated to perform a variety of read operations including continuous page read operations and on-chip ECC in a single-plane NAND Architecture, this architecture is illustrative and variations thereof are contemplated. It will be appreciated that the example of a 2 KB Page size and a specific block size are illustrative and may be different if desired. Moreover, the specific size reference is not to be taken literally, since the actual page size may vary depending on design factors; for example, the term may include a 2,048 Byte main area plus an additional 64 Byte spare area, where the spare area is used for storing ECC and other information such as meta data. In the same way, the term 1 KB may refer to a 1,024 Byte main area and a 32 Byte spare area. While the description herein is based upon a single-plane architecture for clarity, the teachings set forth herein are equally applicable to multi-plane architectures. When multiple physical planes are used, they may share one or more word-lines so that the memory system may service multiple I/O requests simultaneously. Each plane provides a page of data and includes a corresponding data register of one page size and a corresponding cache register of one page size. The techniques described herein may be applied to each plane separately such that each data register and cache register is organized in multiple portions, or may be applied to multiple planes such that each data register and cache register is itself one portion of a multiple page data register and cache register.

FIG. 4 also shows control signals /CS, CLK, DI, DO, /WP and /HOLD which are for the SPI interface. The standard SPI flash interface provides /CS (chip select—complement), CLK (clock), DI (serial data-in), and DO (serial data-out) signals, along with optional signals /WP (write protect—complement) and /HOLD (hold—complement). While the 1-bit serial data bus (data-in through DI and data-out through DO) in the standard SPI interface provides a simple interface and compatibility with many controllers which boot up in single SPI mode, it is limited in achieving higher read thru-put. A multi-bit SPI interface therefore evolved to additionally support dual (2-bit interface) and/or quad (4-bit interface) for increased read thru-put. FIG. 4 also shows additional data bus signals for Dual SPI and Quad SPI operation, i.e. I/O(0), I/O(1), I/O(2), and I/O(3), by selectively redefining the function of four pins. In one illustrative version of the Quad SPI read operation (other versions may be envisioned), the appropriate read command may be given with 1-bit standard SPI interface through I/O(0), but subsequent interface for address and data-out may be Quad based (i.e. 4-bit data bus). The Quad SPI read operation can output 4-bits of data in a clock cycle as compared to output 1-bit of data in standard SPI read operation, and therefore the Quad SPI read operation can provide four times higher read thru-put. While Quad SPI read operation is used herein for explanation, the teachings herein are equally applicable to the other modes of operation, including but not limited to single SPI, dual SPI, Quad Peripheral Interface ("QPI") and Double Transfer Rate ("DTR") read modes. In the QPI protocol, the complete interface (command, address, and data-out) is done on 4-bit basis. In the DTR protocol, the output data is provided on both low-going and high-going CLK edge, rather than providing output data only on low-going CLK edge as in Single Transfer Rate ("STR") read mode operation.

Bad Block Management in the HPSF-NAND Memory

Because of the generally poor reliably of NAND memory cells relative to NOR memory cells, bad block management is employed. The NAND flash memory array 340 includes three areas, the user-addressable area 342, the redundant block area 344, and the Look-Up Table ("LUT") information area 346. The look-up table ("LUT") register 327 stores a look-up table, which contains a mapping from logical block addresses ("LBA's") to physical block addresses ("PBA's") for bad block management. Assume, for example, that the NAND flash memory array 340 has several failed blocks. The failed blocks are mapped to good blocks so that the device may remain in service. Illustratively, bad blocks are mapped first to unused blocks in the redundant block area 344, and then to available blocks in the user-addressable area 342. While any desired mapping scheme may be used, mapping first to the redundant block area maintains full user-addressable memory capacity for as long as possible. To enable effective bad block management, the look-up table may be constructed in the LUT register 327, which is directly accessible to the control logic 330 and the mapping logic 328. Illustratively, the LUT register 327 is implemented in a small and fast volatile memory such as SRAM memory, although it may be implemented in any manner desired and in one or multiple parts. The LUT register 327 may be populated at chip power-up or upon reset by reading LBA and PBA data from the LUT information block 346. Bad block management is described in greater detail in U.S. patent application Ser. No. 13/530,518 filed Jun. 22, 2012 (Michael et al., On-Chip Bad Block Management for NAND Flash Memory), which hereby is incorporated herein in its entirety by reference thereto. Continuous page read as described herein is referred to as "fast continuous page read" in the aforementioned patent application.

Figure 5:
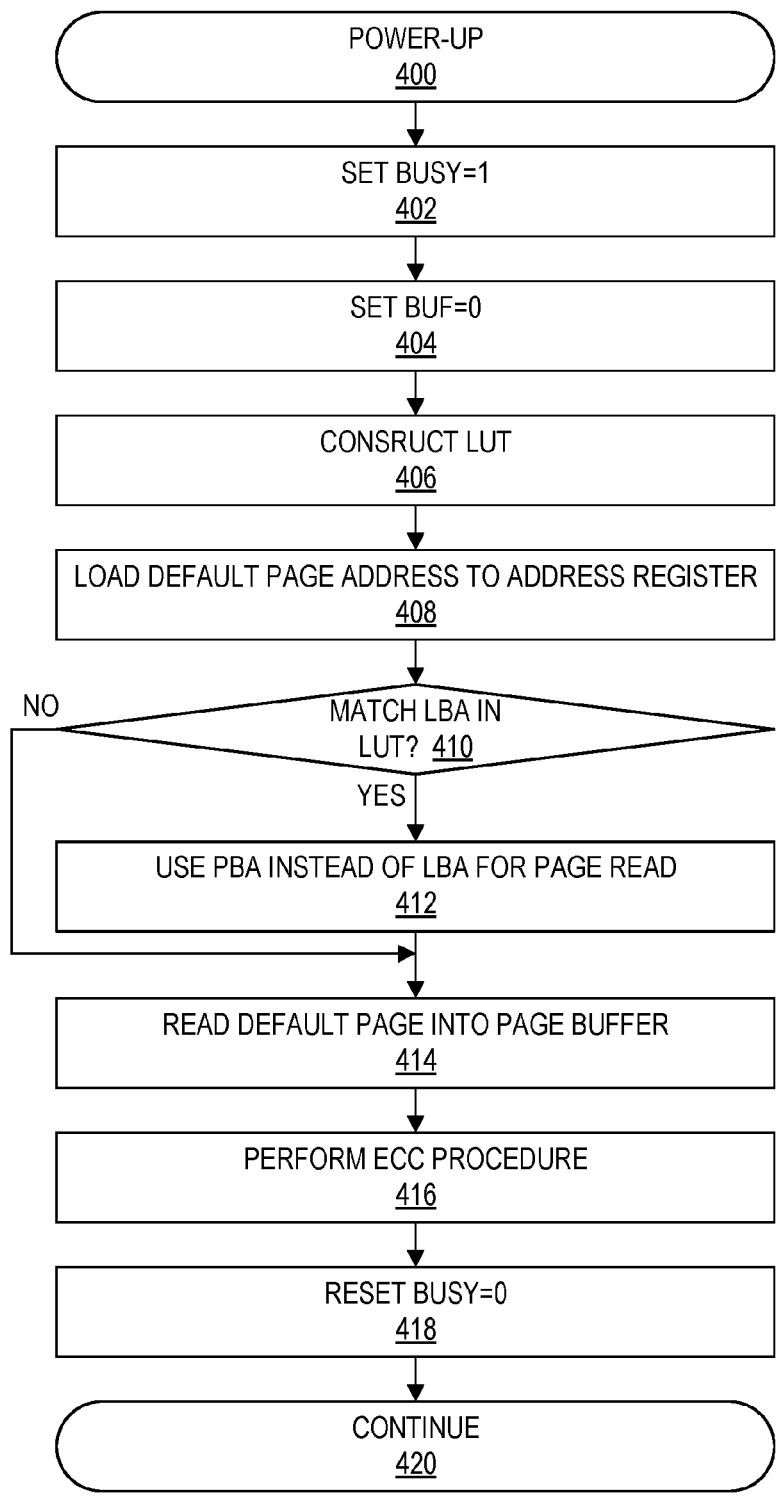
FIG. 5 is a flowchart of the process of powering up a serial NAND flash memory.

FIG. 5 shows an illustrative process 400 for powering-up a serial NAND flash memory, including an automatic default page read which is compatible with bad block mapping and which includes bad block management.

At power-up, the BUSY flag is initialized to 1 (block 402), a buffer flag BUF 347 (FIG. 4) is initialized to the default value of 0 (block 404), the look-up-table is constructed in the LUT register 327 (block 406) from information in the LUT information block 346, and a default page address is loaded into the address register 326 (block 408). Replacement block processing is then performed, which involves searching in the LUT register 327 to determine whether the block address portion of the address in the address register 326 matches any of the LBA's in the LUT register 327 (block 410). This search may be performed quickly without significantly impacting read access time because the LUT register 327 may be a small and fast SRAM that is on-chip and therefore locally accessible by the control logic 330. If no match is found (block 410—no), the LBA is used to read the default page into the page buffer 338 (block 414). If a match is found (block 410—yes), a replaced bad block is indicated and the PBA of the replacement block is used instead of the LBA in the address register 326 (block 412) to read the default page (block 414). An ECC procedure is performed on the data in the page buffer 338 and the resulting ECC bits in the status register(s) 323 are set as appropriate (block 416). Upon completion of the ECC processing, the BUSY flag is reset to 0 (block 418).

ECC Processing in the HPSF-NAND Memory

To achieve fast code shadowing, the next command after power-up with the continuous read mode set (BUF=0) may be any of the common HPSF-NOR memory read commands 03h, 0Bh, 3Bh, 6Bh, BBh and EBh, although the Fast Read Quad Output command 6Bh and the Fast Read Quad I/O command EBh are most suitable since they can output four bits per clock for the highest transfer rate. The continuous read mode read commands, which ignore any address in the command address field, continuously read data seamlessly across page boundaries beginning with the page address contained in the address register 326.

Execution of the continuous read mode read commands may advantageously begin without any latency except for decoding of the command if the ECC procedure is performed by the default page read operation during power-up. Accordingly, the illustrative power-up process 400 performs an ECC procedure (block 416). While the ECC procedure may be performed on the entire page buffer 338, if a ping-pong buffer arrangement is used for the page buffer 338 to improve the speed of the continuous read mode read, then the ECC procedure need be performed on only half of the page buffer 338 to also reduce the time needed to complete the default page read.

Figure 6:
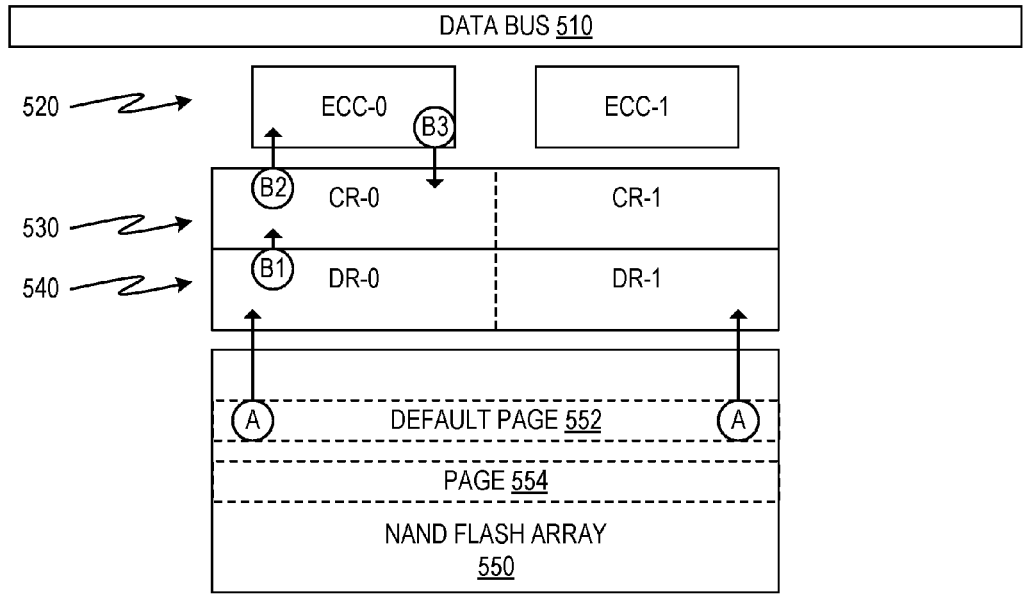
FIG. 6 is a functional block diagram of the functioning of a buffer having a data register and a cache register during the power-up process of FIG. 5.

FIG. 6 shows a data bus 510 and a NAND flash array 550, together with an illustrative implementation of a page buffer which includes a data register 540 that is organized in two portions which may be referred to as data register-0 ("DR-0") and data register-1 ("DR-1"). The page buffer also includes a cache register 530 that is organized in two portions which may be referred to as cache register-0 ("CR-0") and cache register-1 ("CR-1"). Therefore, the page buffer may be thought of as having a portion which includes CR-0 and DR-0, and another portion which includes CR-1 and DR-1. In an illustrative example, the page buffer may have a capacity of 4K Bytes, divided into two equal portions of 2K Byte capacity each. As such, the storage capacity for each of DR-0, DR-1, CR-0, and CR-1 is 1K Byte. DR may be used to refer to a full 2K Byte data register (i.e. DR-0 plus DR-1) and CR may be used to refer to a full 2K Byte cache register (CR-0 plus CR-1). A different size of page buffer may be used and/or a division of the page buffer into more than two portions or into unequal portions may be done if desired. Two sets of control signals may be needed for two portions of the page buffer, unlike one set of control signals needed for an undivided page buffer. Furthermore, differences between the logical and physical NAND flash array does not affect teachings herein. For example, the physical array may have two pages (even 2 KB page and odd 2 KB page) on one word line, so that a word line may be 4 KB of NAND bit cells. For clarity, the description and drawings herein are based upon the logical NAND flash array. Furthermore, while the page buffer is organized into 2 portions to support a continuous read operation, the change is transparent to the user. The program operation may be done for standard page size of 2 KB, and standard read operation, e.g. command to read the page data from cache after completing a page read operation, may be also done for standard page size of 2 KB. As such the internal organization of the page buffer into two portions is particularly suitable for the continuous page read operation, and even then is such that its internal division is transparent to the user. The page buffer for a NAND memory array may be suitably organized and operated to eliminate gaps and discontinuities in the output data during a continuous page read in accordance with the techniques described in U.S. patent application Ser. No. 13/464,535 filed May 4, 2012 (Gupta et al., Method and Apparatus for Reading NAND Flash Memory), which hereby is incorporated herein in its entirety by reference thereto. Continuous page read as described herein is referred to as "modified continuous page read" in the aforementioned patent application.

FIG. 6 also illustratively shows an error correction circuit 520, which logically may be thought of as having a section ECC-0 which provides error correction of the contents of the cache register portion CR-0, and a section ECC-1 which provides error correction of the contents of the cache register portion CR-1. Various ECC algorithms are suitable for use, including, for example, Hamming ECC algorithm, BCH ECC algorithm, Reed-Solomon ECC algorithm, and others. While two logical ECC sections ECC-0 and ECC-1 are shown as respectively interfacing with CR-0 and CR-1 for clarity of explanation, either two physical ECC blocks or a single physical ECC block may be used to interface with both CR-0 and CR-1.

FIG. 6 shows operation of the data register 540 and cache register 530 during the default page read operation at power-up. The address of the default page 552 is resident in the address register 326, and the default page is read from the NAND flash array 550 into both parts DR-0 and DR-1 of the data register 540 (Operation A). Illustratively, 2 KB of data is transferred from page 552, and illustratively, the transfer may proceed in one 2 KB transfer or in separate 1 KB transfers into DR-0 and DR-1, which may or may not be simultaneous. The time for a page read operation (i.e. time to transfer page data from a NAND flash array to the data register) is illustratively 20 µs, although the exact time may vary depending on such design factors as the sensing circuit, type of cell (single-level cell or multi-level cell), and the technology node (such as 50 nm or 35 nm). Next, the data in portion DR-0 of the data register 540 is transferred to portion CR-0 of the cache register 530 (Operation B1), an ECC computation is performed on the data in portion CR-0 of the cache register 530 (Operation B2), and ECC-processed data is returned to portion CR-0 of the cache register 530 (Operation B3). The time for the transfer from DR-0 to CR-0 (and DR-1 to CR-1 as well) varies depending on design choice, but typically ranges from about 1 µs to about 3 µs. The time required for the error correction circuit 520 to complete depends on the choice of ECC algorithm, the internal data bus, the on-chip timing oscillator period, and other design factors. Illustratively, assuming a physical design which uses one ECC circuit block for both portions CR-0 and CR-1 of the cache register 530, and further assuming the time for CR-0 and CR-1 data to be sent out to be 20 µs and the time for the DR-0 to CR-0 transfer and the DR-1 to CR-1 transfer to be 2 µs, the error correction circuit may be designed to complete in 18 µs or less, thereby requiring 36 µs for both CR-0 and CR-1 if only a single circuit is used. The page read ends without clocking out data, although the data register 540 and the cache register 530 are set up for a continuous read mode read command.

Figure 8:
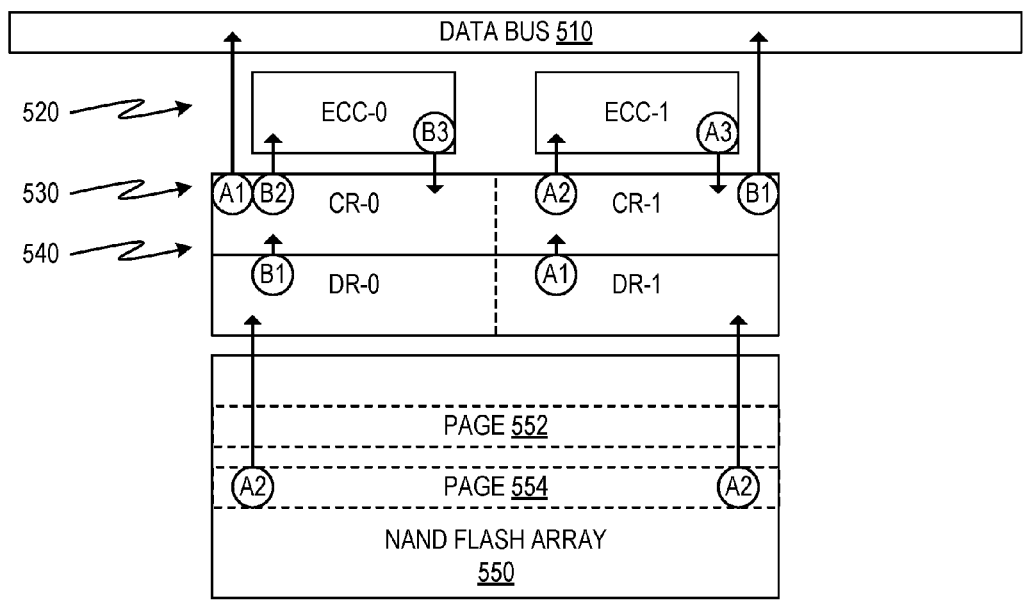
FIG. 8 is a functional block diagram of the functioning of a buffer having a data register and a cache register during the continuous read mode process of FIG. 7.
Figure 7:
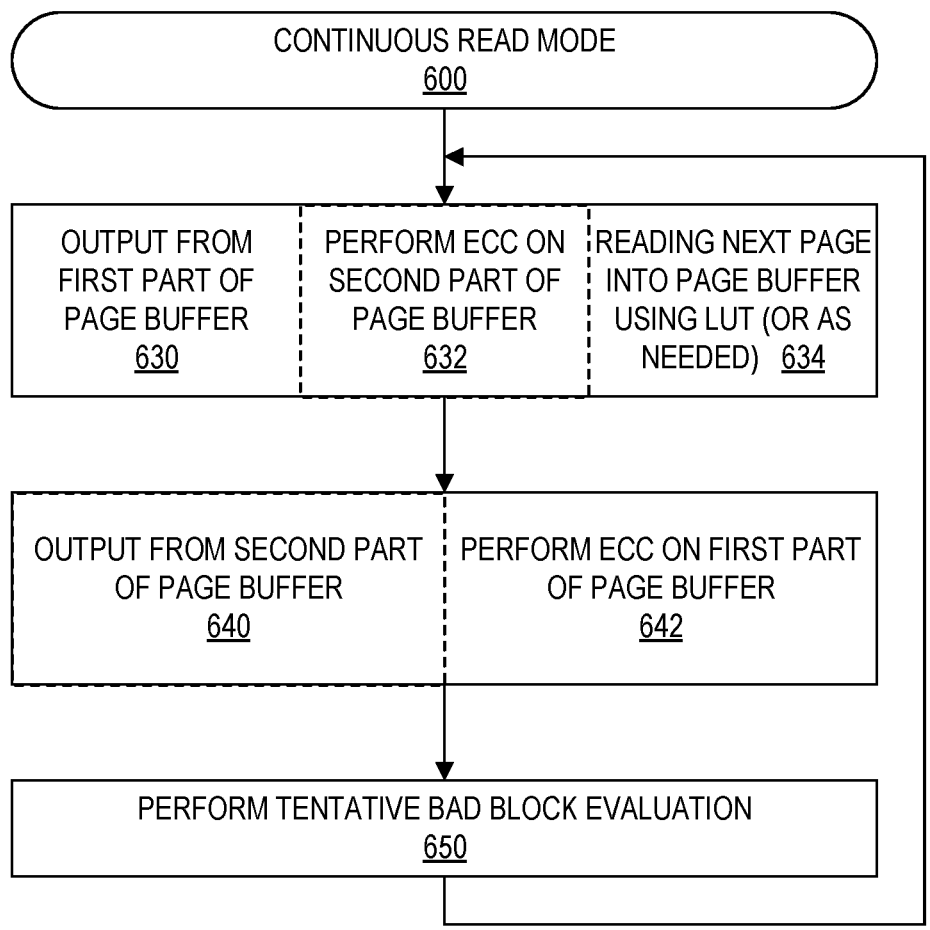
FIG. 7 is a flowchart of the process of operating a serial NAND flash memory in a continuous read mode.

FIG. 7 shows an illustrative process 600 for a basic continuous read mode read which is compatible with bad block mapping and which includes bad block management, and which begins execution without any latency except for decoding of the read command. FIG. 8 shows certain operations involving the data register 540 and the cache register 530, which are referred to in FIG. 7. Initial conditions for the read command are for the default page starting address to be present in the address register 326 and for ECC-processed data to be present in the page buffer.

Three essentially concurrent operations may then take place, namely that a first part of the page buffer, specifically portion CR-0 of the cache register 530, is output (block 630 and Bus Operation A1), ECC processing is performed on a second part of the page buffer, specifically portion CR-1 of the cache register 530 (block 632 and Buffer Operations A1, A2 and A3), and the next page of data is read into the page buffer, specifically portions DR-0 and DR-1 of the data register 540 (block 634 and Array Operation A2). The Bus Operation A1 and the Buffer Operation A1 start at about the same time (time 1) within time interval A, but the latter is much small in duration. Similarly, the Array Operation A2 and the Buffer Operation A2 start at about the same time (time 2 later than time 1) within time interval A, but the latter is much small in duration. The next page of data may be accessed by incrementing the address in the address register 326 with the on-chip address counter 329 (FIG. 4), and then performing replacement block processing. Replacement block processing need only be performed at the time of the first page access and at each block boundary, although to avoid additional circuit complexity to detect such occurrences, replacement block processing may be performed at each page access without harm.

Next, two essentially concurrent operations may then occur, namely that the second part of the page buffer, specifically portion CR-1 of the cache register 530, is output (block 640 and Bus Operation B1), and ECC processing is performed on the first part of the page buffer, specifically portion CR-0 of the cache register 530 (block 642 and Buffer Operations B1, B2 and B3). Bus Operation B1 tends to take the most time, so no additional time is needed provided the Buffer Operations B1, B2 and B3 occur within the time of the Bus Operation B. The Bus Operation B1 and the Buffer Operation B1 start at about the same time (time 1) within time interval B, but the latter is much small in duration.

Since a full page of data is now output (Bus Operations A1 and B1) and the ECC bits in the status register(s) 323 is (are) now set, a tentative bad block evaluation may be performed (block 650). Bad block evaluation is described in greater detail in U.S. patent application Ser. No. 13/530,518 filed Jun. 22, 2012 (Michael et al., On-Chip Bad Block Management for NAND Flash Memory), which hereby is incorporated herein in its entirety by reference thereto. Continuous page read as described herein is referred to as "fast continuous page read" in the aforementioned patent application.

The continuous read mode process 600 repeats until terminated in any desired manner. One illustrative technique is to stop the clock signal CLK followed by a low to high transition in /CS so that the continuous read is not resumed upon resumption of CLK. Alternatively, the continuous read mode may be designed to terminate upon assertion of another signal, after a predetermined or specified number of page reads, or in any other manner desired by the designer. Advantageously, since no additional read commands are used to read the subsequent pages, command decode time is avoided. Advantageously, the ping-pong buffer technique allows ECC processing time and next page read time to be essentially hidden in the time used for continuous data output. Advantageously, the incorporation of a fast on-chip LUT register such as the LUT register 327 (FIG. 4) which is locally accessible by control logic such as the control logic 330 (FIG. 4), enables a continuous page read with bad block management from the NAND flash memory without significantly delaying the page read time when a replacement block is encountered, thereby further helping to avoid any gaps or discontinuities across page and block boundaries. Advantageously, the concurrent Bus Operation A1, the Page Operation A2 (delayed by the time needed for the Buffer Operation A1), and the Buffer Operations A1, A2 and A3 may be designed to take about the same time, thereby optimizing time utilization. The time for transferring and outputting a half page of data on the data bus 510 is illustratively about 20 µs assuming a clock frequency of 100

MHz, and the time for a page read operation is illustratively about 20 μs, although the time for any particular design may vary depending on various design considerations.

Advantageously, although the time required for a page read and ECC processing, illustratively about 40 μs, may be considered to be an initial latency, it occurs during power-up and does not impact the command programming. In contrast, the continuous read mode reads have no latency aside from the command decode time. Although the page read command may require a time to complete that may approach about 60 μs, the page read command is issued only once for a continuous read across successive page boundaries.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. For example, although many of the implementations described herein are for serial NAND memory, certain techniques described herein such as the power-up sequence, mode selection, and continuous data output across page boundaries and from logically contiguous memory locations without wait intervals, may be used for parallel NAND memory. Moreover, specific values given herein are illustrative, and may be varied as desired. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A method of operating a NAND flash memory device comprising:
   receiving a read command which corresponds to a high-performance serial flash NOR ("HPSF-NOR") read command and is clock-compatible therewith; and
   providing, from the NAND flash memory device in response to the read command receiving step, a continuous data output across page boundaries and from logically contiguous memory locations without wait intervals.

2. The method of claim 1 wherein the read command is one of a Read command 03h, a Fast Read command 0Bh, a Fast Read Dual Output command 3Bh, a Fast Read Quad Output command 6Bh, a Fast Read Dual I/O command BBh, or a Fast Read Quad I/O command EBh.

3. The method of claim 1 wherein the NAND flash memory device comprises a NAND flash memory array and a page buffer coupled to the NAND flash memory array, and wherein the providing step comprises:
   reading a page of data from the NAND flash memory array to the page buffer;
   ECC processing data in the page buffer to produce ECC processed data; and
   outputting ECC processed data from the page buffer;
   wherein time used for the page reading step and the ECC processing step is buried in time used for the data outputting step.

4. The method of claim 1 wherein the page reading step is performed using bad block management.

5. The method of claim 1 wherein the NAND flash memory device comprises a NAND flash memory array and a page buffer coupled to the NAND flash memory array, and further comprising:
   selecting a page of the NAND flash memory array;
   storing data from the selected page in the page buffer;
   performing ECC computations on the data in the page buffer;
   outputting the data from the page buffer; and
   repeating the page selecting, data storing, ECC computation performing, and data outputting steps so that the continuous data output is provided;
   wherein the page selecting step initially comprises selecting a default page in the NAND flash memory array, and subsequently comprises selecting successive sequential pages of the NAND flash memory array;
   wherein the page selecting, data storing, and ECC computation performing steps are initially performed automatically during power-up of the flash memory, and are subsequently performed in response to the read command; and
   wherein the data outputting step is performed in response to the read command.

6. The method of claim 1 further comprising:
   selecting a default page of a NAND flash memory array of the NAND flash memory device during power-up thereof;
   storing data from the default page of the NAND flash memory array in a page buffer during power-up of the NAND flash memory;
   performing ECC computations on the data stored in the page buffer after the storing step; and
   receiving the read command.

7. The method of claim 1 wherein the NAND flash memory device comprises a NAND flash memory array and a page buffer associated with the NAND flash memory array, further comprising:
   setting the flash memory device in a continuous read mode or a buffer read mode;
   transferring a page of data from a default page of the NAND flash memory array to the page buffer;
   after the page data transferring step, receiving the read command; and
   when the flash memory device is in the continuous read mode, outputting the continuous data output from the flash memory device in response to the read command receiving step.

8. The method of claim 7 further comprising:
   ECC processing the default page of data in the page buffer to provide an ECC processed default page of data;
   wherein the read command is received after the ECC processing step;
   wherein when the flash memory is in the continuous read mode, outputting the continuous data beginning with the ECC processed default page of data in the page buffer.

9. The method of claim 8 further comprising establishing the default page under a manufacturer's control.

10. The method of claim 8 further comprising establishing the default page under a user's control.

11. A method of operating a memory having a NAND flash memory array and a page buffer coupled to the NAND flash memory array, comprising:
   receiving a continuous read command comprising a command code and a starting address; and
   providing, from the NAND flash memory array via the page buffer and in response to the read command receiving step, a continuous data output across page boundaries and from logically contiguous memory locations without wait intervals;

wherein the providing step begins with column 00 of the page buffer regardless of the starting address.

12. The method of claim 11 wherein the read command is one of a Read command 03h, a Fast Read command 0Bh, a Fast Read Dual Output command 3Bh, a Fast Read Quad Output command 6Bh, a Fast Read Dual I/O command BBh, or a Fast Read Quad I/O command EBh.

* * * * *